(12) United States Patent
Tomita et al.

(10) Patent No.: US 8,796,869 B2
(45) Date of Patent: Aug. 5, 2014

(54) SEMICONDUCTOR DEVICE AND METHOD OF MANUFACTURING THE SAME

(75) Inventors: Hiroaki Tomita, Ota (JP); Kazuyuki Suto, Ashikaga (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 10 days.

(21) Appl. No.: 13/204,199

(22) Filed: Aug. 5, 2011

(65) Prior Publication Data

US 2012/0032307 A1     Feb. 9, 2012

(30) Foreign Application Priority Data

Aug. 6, 2010   (JP) ................................ 2010-176865

(51) Int. Cl.
     *H01L 23/48*      (2006.01)

(52) U.S. Cl.
     USPC ........... 257/786; 257/734; 257/730; 257/774; 257/737; 257/784; 257/783; 257/782; 257/778; 257/780; 257/781; 257/698

(58) Field of Classification Search
     CPC ..... H01L 21/78; H01L 23/3114; H01L 29/06; H01L 21/30
     USPC .......... 257/618, E29.005, E21.211, 668, 774, 257/E21.01, 701, E21.599, E29.022, 620, 257/783; 438/458
     See application file for complete search history.

(56) References Cited

U.S. PATENT DOCUMENTS

| | | | |
|---|---|---|---|
| 5,925,931 A * | 7/1999 | Yamamoto | 257/737 |
| 6,444,489 B1 * | 9/2002 | Lin | 438/107 |
| 7,312,107 B2 | 12/2007 | Noma et al. | |
| 2004/0137701 A1 * | 7/2004 | Takao | 438/461 |
| 2005/0048740 A1 * | 3/2005 | Noma et al. | 438/460 |
| 2006/0068572 A1 * | 3/2006 | Noma et al. | 438/577 |
| 2008/0157098 A1 * | 7/2008 | Noma | 257/80 |
| 2010/0102460 A1 * | 4/2010 | Tomita et al. | 257/786 |
| 2010/0289092 A1 * | 11/2010 | Perng et al. | 257/401 |

FOREIGN PATENT DOCUMENTS

| | | |
|---|---|---|
| JP | 9-69479 | 3/1997 |
| JP | 9-211849 | 8/1997 |
| JP | 2005-72554 | 3/2005 |

* cited by examiner

*Primary Examiner* — Asok K Sarkar
*Assistant Examiner* — Dmitriy Yemelyanov
(74) *Attorney, Agent, or Firm* — Abel Law Group, LLP

(57) ABSTRACT

In a CSP type semiconductor device, the invention prevents a second wiring from forming a narrowed portion on a lower surface of a step portion at the time of forming the second wiring that is connected to the back surface of a first wiring formed near a side surface portion of a semiconductor die on the front surface and extends onto the back surface of the semiconductor die over the step portion of a window that is formed from the back surface side of the semiconductor die so as to expose the back surface of the first wiring. A glass substrate is bonded on a semiconductor substrate on which a first wiring is formed on the front surface near a dicing line with an adhesive resin being interposed therebetween. The semiconductor substrate is then etched from the back surface to form a window having step portions with inclined sidewalls around the dicing line as a center. A second wiring is then formed so as to be connected to the first wiring exposed in the window and extend onto the back surface of the semiconductor substrate over the step portions of the window except part of the step portions on the dicing line and near the dicing line, which extend perpendicular to the dicing line.

15 Claims, 15 Drawing Sheets

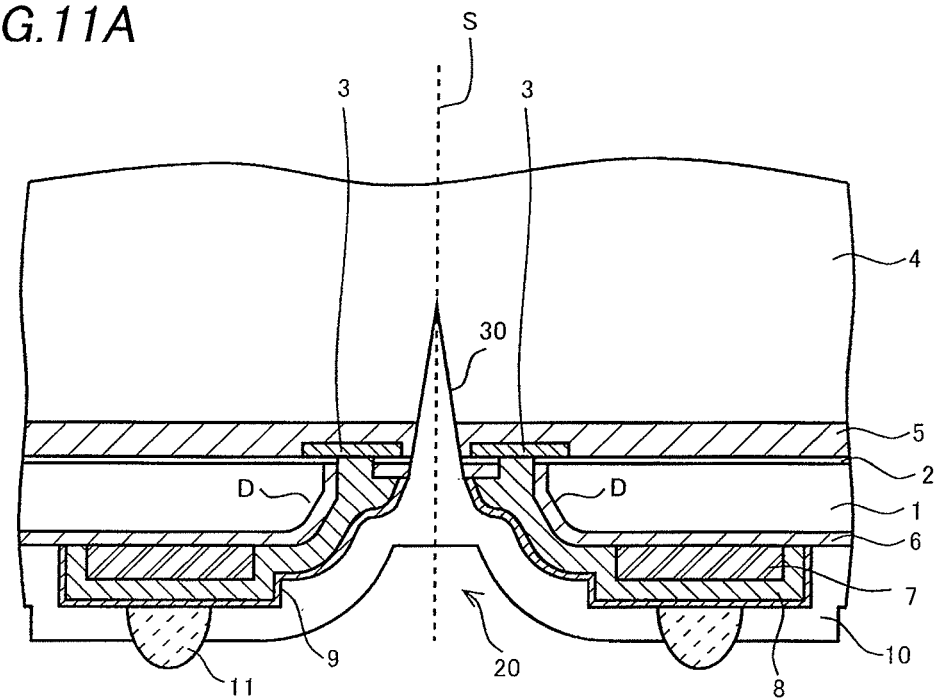
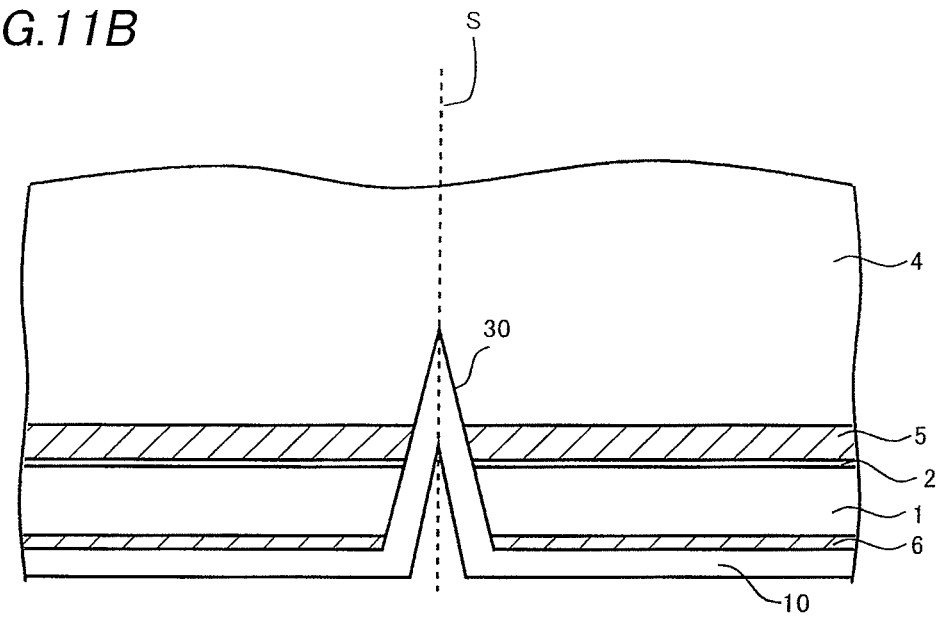

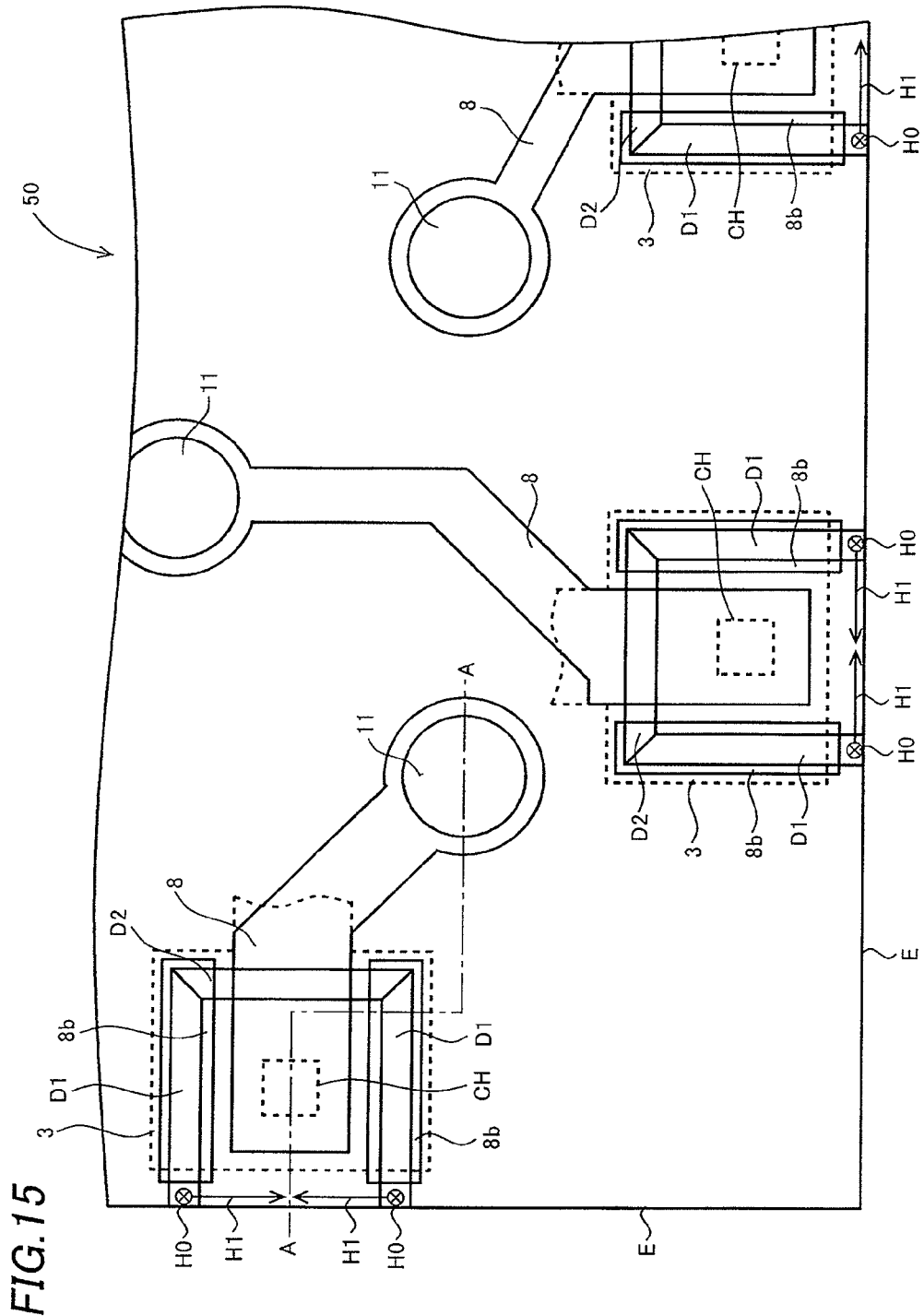

SEMICONDUCTOR DEVICE AND METHOD OF MANUFACTURING THE SAME

CROSS-REFERENCE OF THE INVENTION

This application claims priority from Japanese Patent Application No. 2010-176865, the content of which is incorporated herein by reference in its entirety.

BACKGROUND OF THE INVENTION

1. Field of the Invention

The invention relates to a semiconductor device and a method of manufacturing the same, in particular, to a semiconductor device and a method of manufacturing the same relating to forming a wiring extending over a step portion near a dicing line from the lower surface to the upper surface of the step portion.

2. Description of the Related Art

In a process of manufacturing a semiconductor device, a pattern need be formed over various step portions such as a LOCOS (Local Oxidation of Silicon) step, a polysilicon wiring step, an aluminum wiring step and so on from the lower surfaces to the upper surfaces of these step portions by a photolithography process. In this case, since exposure light incident perpendicularly on a step portion is reflected obliquely, sometimes a pattern transferred on a semiconductor substrate does not correspond to a photomask pattern.

In a manufacturing line in which miniaturization is enhanced, a photoresist is mainly of a positive type. In a case of a positive resist, a reticle (photomask) of which a portion for forming a pattern on a semiconductor substrate is black is used, and the positive resist on the semiconductor substrate that is exposed to light perpendicularly entering through the transparent portion of the reticle is removed through a development process. The black pattern of the reticle is transferred on the semiconductor substrate.

In this case, light reflected at various step portions as described above existing on the semiconductor substrate may enter under the black pattern of the reticle and the photoresist in a portion that should not be exposed to light may be exposed to the light. The resist in the portion where light enters under the pattern to be transferred on the semiconductor substrate is also removed through a development process, resulting in forming a narrower pattern on the semiconductor substrate than a designed pattern or resulting in separation of the pattern in a worse case.

In a case of forming a large pattern by a design rule that does not need miniaturization on a semiconductor substrate, ordinarily, a positive type photoresist is not used and a negative type photoresist is used. In this case, a negative resist irradiated with light is hardened and a negative resist in a portion that is not irradiated with light is removed through a development process.

Therefore, even if a negative resist under a black pattern of a reticle is exposed to light reflected at a step portion, the width of the hardened negative resist only increases to form a protruding portion in the pattern, and separation does not occur in the pattern. Ordinarily, the increased width of the pattern does not cause a problem in a case of a non-miniaturized design rule.

As a method of preventing an abnormal pattern such as a narrowing or protruding portion from being transferred on a semiconductor substrate by light reflected at a step portion, covering a surface of an object to be exposed with a reflection preventing film, treating a photoresist material, and so on are disclosed in Japanese Patent Application Publication Nos. Hei 9-69479, Hei 9-211849 and 2005-072554.

In a case of forming an electrode pattern having high reflectance over a step portion formed on a semiconductor substrate from the lower surface to the upper surface, the probability that an abnormal pattern such as a narrowing portion is formed on the semiconductor substrate by light reflected at the step portion increases more. Such an abnormal pattern causes a problem usually when a miniaturized positive type photoresist is used. Japanese Patent Application Publication No. Hei 9-69479 and so on belong to this case.

Ordinarily, in a case of using a negative resist for a large pattern by a design rule, exposure light reflected at a step portion does not cause a serious problem since it only slightly enlarges a transferred pattern on a semiconductor substrate. However, there is a case that a positive resist is used even for a large pattern by a design rule. In a semiconductor device manufacturing line that uses a positive resist in almost all photolithography processes for miniaturized patterns, such a case occurs when a non-miniaturized pattern is to be formed only in a few processes.

In this case, although the pattern may be formed by using a negative resist, it is necessary to prepare two kinds of resist materials and two kinds of developers for each of a resist coating process and a resist development process, respectively, and there occurs a problem in material arrangement, material keeping, equipment keeping, a equipment operating ratio and so on. Furthermore, it is difficult to obtain a negative resist at low cost since a positive resist is mainly used nowadays.

Even in such a case of using a positive resist for a large pattern by a design rule, light reflected at a step portion may cause a problem.

This is in a case where a glass substrate 4 or the like is bonded on a semiconductor substrate 1 on which a first wiring 3 is formed on the front surface side near a dicing line S and the semiconductor substrate 1 is etched from the back surface side of the semiconductor substrate 1 to expose the back surface of the first wiring 3 as shown in FIGS. 5A and 13. In this case, a step portion D is formed, having a thickness of about 100 μm or more and having inclined surfaces from the back surface of the semiconductor substrate 1 to the back surface of the first wiring 3 formed on the front surface of the semiconductor substrate 1.

When a second wiring 8 connected to the back surface of the first wiring 3 and extending over this step portion D onto the back surface of the semiconductor substrate 1 is formed by using a positive type photoresist as shown in FIG. 8, light reflected at the step portion D may causes an abnormal narrowed portion 8a as shown in FIG. 2 in the second wiring 8 on the lower surface of the step portion D including a portion connected to the first wiring 3. When the narrowed portion 8a is formed in the second wiring 8 on the lower surface of the step portion D and thus the second wiring 8 is narrowed, the wiring resistance of the second wiring increases and disconnection occurs in an extremely worse case.

Therefore, when the second wiring 8 is formed over the step portion D existing near the dicing line S, it is necessary to prevent the second wiring 8 from having an abnormal narrowed portion 8a on the lower surface of the step portion D.

SUMMARY OF THE INVENTION

The invention provides a semiconductor device that includes a semiconductor die having a front surface, a back surface and a side surface connecting the front and back surfaces, and a concave portion formed in the back surface of the semiconductor die so that in plan view of the semiconductor die the concave portion has a first edge defined by the side surface of the semiconductor die and second, third and fourth edges each defined by an inclined sidewall. The inclined sidewalls are inclined so that the concave portion is wider at the back surface than at the front surface. The device also includes a first insulation film disposed on the front surface of the semiconductor die, a second insulation film disposed on the back surface of the semiconductor die, a first wiring disposed on the first insulation film and a second wiring disposed on the second insulation film and connected to the first wiring that is exposed in the concave portion through the first insulation film. The second wiring extends from the back surface to the front surface of the semiconductor die so as to cover the three inclined sidewalls and a bottom of the concave portion but not to arrive at the first edge of the concave portion. The device also includes a supporting substrate bonded to the front surface of the semiconductor die, and an adhesive layer bonding the supporting substrate to the front surface of the semiconductor die. The second wiring may be divided in to an operable wiring portion and isolated dummy wiring portions which are placed on the included sidewalls perpendicular to the first edge of the concave portion.

The invention also includes a method of manufacturing a semiconductor device. The method includes providing a semiconductor substrate having a first insulation film disposed on a first surface of the semiconductor substrate and a pair of first wirings disposed on the first insulation film. A dicing line of the semiconductor substrate runs between the pair of the first wirings. The method also includes bonding a supporting substrate to the first surface of the semiconductor substrate using an adhesive, and forming an opening in the semiconductor substrate so as to expose the first insulation film by removing part of the semiconductor substrate from a second surface of the semiconductor substrate opposite from the first surface so that in plan view of the semiconductor substrate the opening has edges. Each of the edges is defined by an inclined sidewall, and the inclined sidewalls are inclined so that the opening is wider at the second surface than at the first surface. The method also includes forming a second insulation film on the second surface of the semiconductor substrate, exposing the first wirings by removing part of the first insulation film in the opening, and forming a second wiring on the second insulation film so as to be connected to the exposed first wirings in the opening and so as to extend from the second surface to the first surface of the semiconductor substrate to cover the three inclined sidewalls and a bottom of the concave portion but not to arrive at the dicing line. The method also includes forming a notch in the semiconductor substrate from the second surface along the dicing line, and dividing the semiconductor by dicing along the notch. The second wiring may be divided in to an operable wiring portion and isolated dummy wiring portions which are placed on the included sidewalls perpendicular to the dicing line.

BRIEF DESCRIPTION OF THE DRAWINGS

FIGS. 11A and 11B are cross-sectional views showing the method of manufacturing the semiconductor device of the first embodiment of the invention.

FIG. 15 is an enlarged plan view of a semiconductor device on the back surface, showing a semiconductor device and a method of manufacturing the same of a second embodiment of the invention.

DETAILED DESCRIPTION OF THE INVENTION

Figure 1:
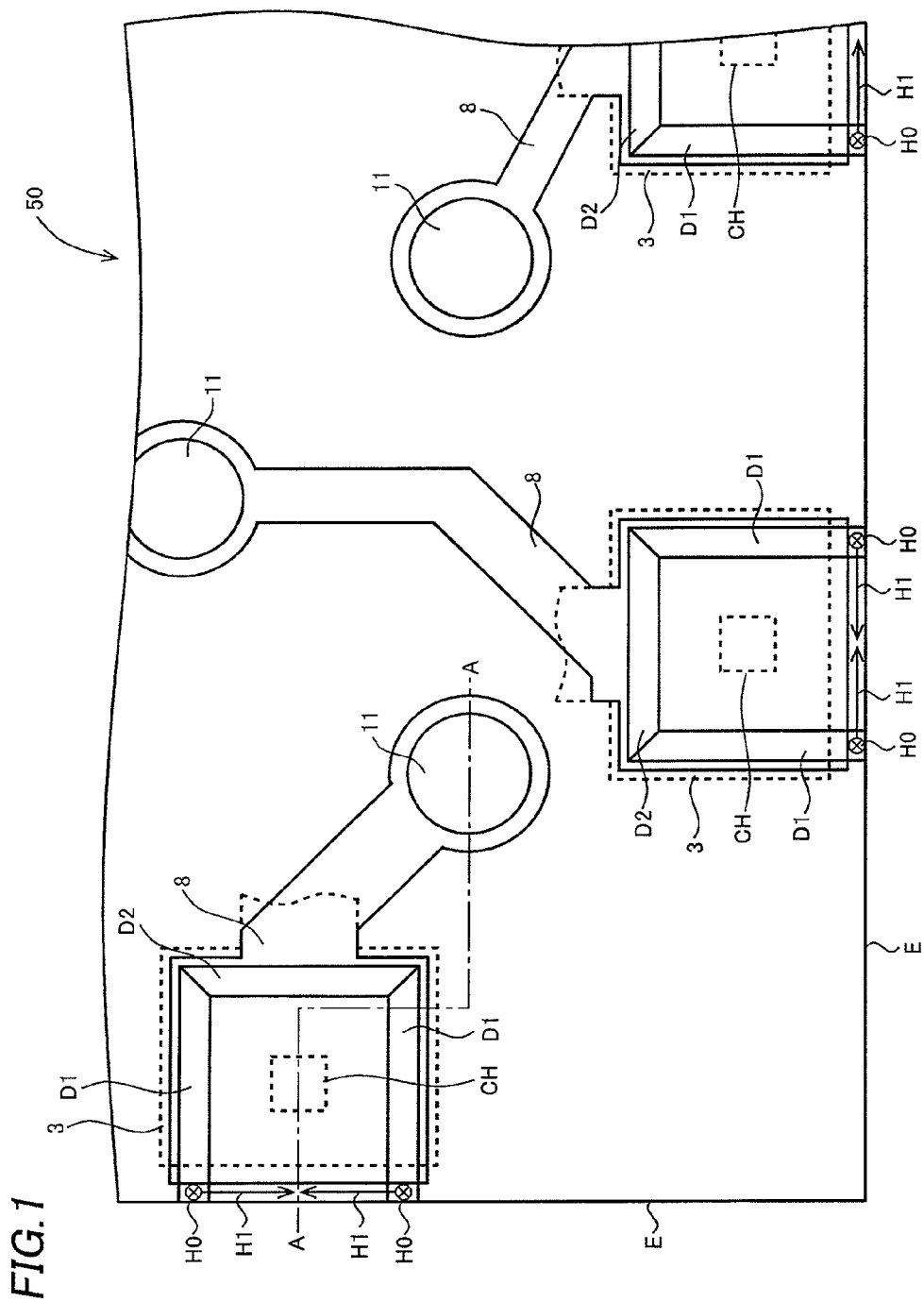
FIG. 1 is an enlarged plan view of a semiconductor device on the back surface, showing a semiconductor device and a method of manufacturing the same of a first embodiment of the invention.
Figure 2:
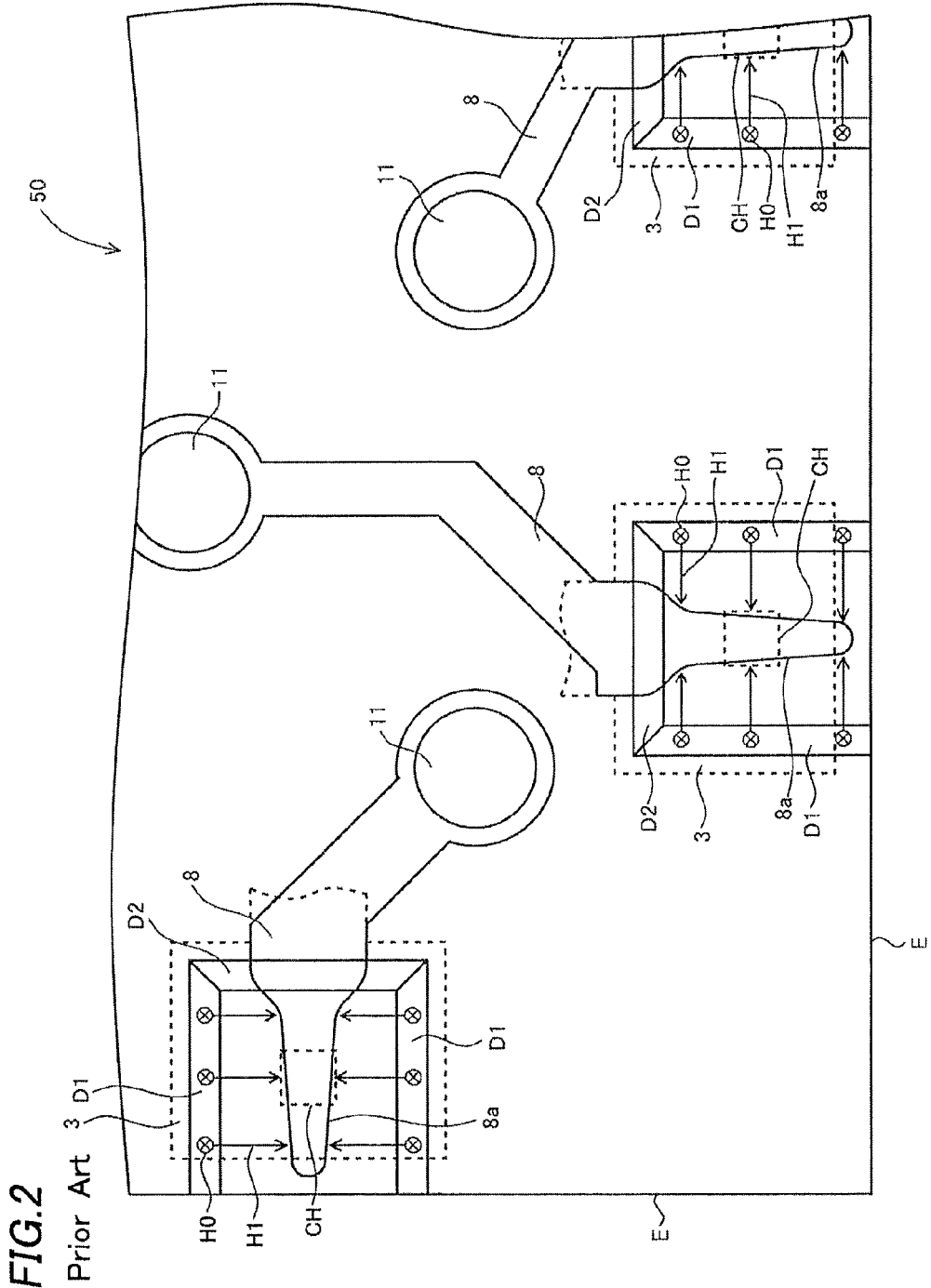
FIG. 2 is an enlarged plan view of a semiconductor device on the back surface, showing a semiconductor device and a method of manufacturing the same of a comparison example.
Figure 3:
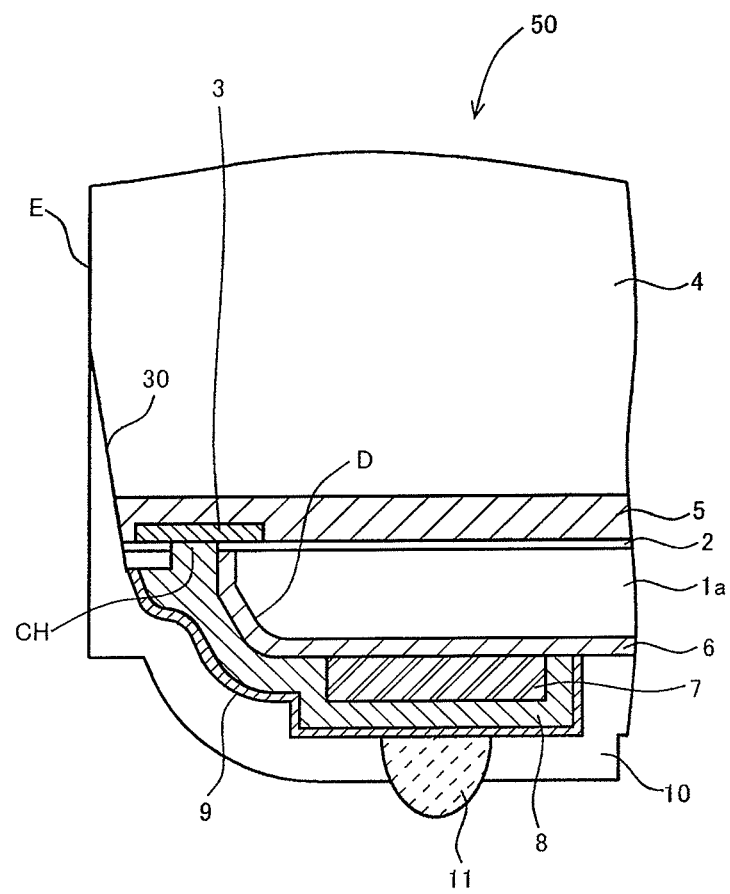
FIG. 3 is a cross-sectional view showing the semiconductor device of the first embodiment of the invention.

A semiconductor device 50 of a first embodiment of the invention will be described referring to FIGS. 1 and 3 hereafter. FIG. 1 shows a part of an enlarged schematic plan view of the semiconductor device 50 from the back surface side. FIG. 3 is a schematic cross-sectional view along A-A of FIG. 1. The semiconductor device 50 of the invention is a CSP (Chip Size Package) type semiconductor device. FIG. 2 shows a schematic plan view of a semiconductor device having a problem from the back surface side for comparison, differing from the invention.

As shown schematically in FIG. 3, the semiconductor device 50 of the invention has a semiconductor die 1a on which a first wiring 3 is formed on the front surface near the end portion, and a glass substrate 4 is bonded on the front surface of the semiconductor die 1a with an adhesive layer 5 being interposed therebetween. Furthermore, the end surface of the semiconductor die 1a has a step portion D extending from the back surface side of the semiconductor die 1a to the back surface of the first wiring 3 and having an inclined surface. A second wiring 8 extends over the step portion D, being connected to the first wiring 3 and extending from the end portion of the semiconductor die 1a to the back surface of the semiconductor die 1a with a second insulation film 6 being interposed therebetween.

As shown by a plan view of FIG. 1, the step portion D includes two step portions D1 extending perpendicular to an end surface E of the semiconductor device 50 and a step portion D2 extending parallel with the end surface E. It means that the step portion D forms a concave portion from the end surface of the semiconductor die 1a toward the inner portion.

In the semiconductor device 50 of the invention, as shown in FIG. 1, the second wiring 8 extending from the end portion of the semiconductor die 1a onto the back surface of the semiconductor die 1a extends over the step portion D except on part of the step portions D1 near the end surface E, which extend perpendicular to the end surface E of the semiconductor device 50.

As a result of this, as shown by a manufacturing method described below, exposure light H0 incident from the back surface side of the semiconductor die 1a does not enter the step portion D covered by a black reticle pattern that forms the same pattern as the second wiring. Therefore, there does not exist exposure light H0 entering the step portion D and thus there does not exist reflected light H1 from the step portion D.

However, reflected light H1 as shown by arrows in FIG. 1 occurs at the part of the step portions D1 near the end surface E, which extend perpendicular to the end surface E of the semiconductor device 50 and are not covered by the black reticle pattern. However, since the second wiring 8 is not formed in this portion, even if the reflected light H1 exists, this does not cause a problem in forming the second wiring.

FIG. 2 shows a state when the second wiring 8 is formed over only the step portion D2 extending parallel with the end surface E of the semiconductor device 50 without over the step portions D1, as a comparison example. Exposure light H0 entering the step portions D1 turns into reflected light H1 shown by arrows, and enters perpendicular to the sides of the second wiring 8 extending toward the end surface E of the semiconductor device 50. As a result, the positive resist in these portions is exposed to the light, and finally an abnormal narrowed portion 8a is formed in the second wiring 8 as shown in the figure. In an extremely worse case, the second wiring 8 is almost disconnected or disconnected.

On the other hand, in the semiconductor device 50 of the invention, since the second wiring 8 is formed over the step portion D except the part of the step portions D1 near the end surface E, which extend perpendicular to the end surface E of the semiconductor device 50, it is prevented that the reflected light H1 of the exposure light H0 entering the step portion D causes the second wiring 8 to have the abnormal narrowed portion 8a. As a result, disconnection or the like does not occur in the second wiring 8 on the lower surface of the step portion D, thereby realizing a semiconductor device having high yield and reliability.

As described above, the second wiring 8 extending over the step portion D onto the back surface side of the semiconductor die 1a except the part of the step portions D1 near the end surface E, which extend perpendicular to the end surface E of the semiconductor device 50, is the feature of the invention.

Hereafter, a method of manufacturing the semiconductor device of the invention will be described referring to cross-sectional views of the semiconductor device in FIGS. 4 to 12B and a plan view of the semiconductor device on the back surface side in FIGS. 1 and 13.

Figure 4:
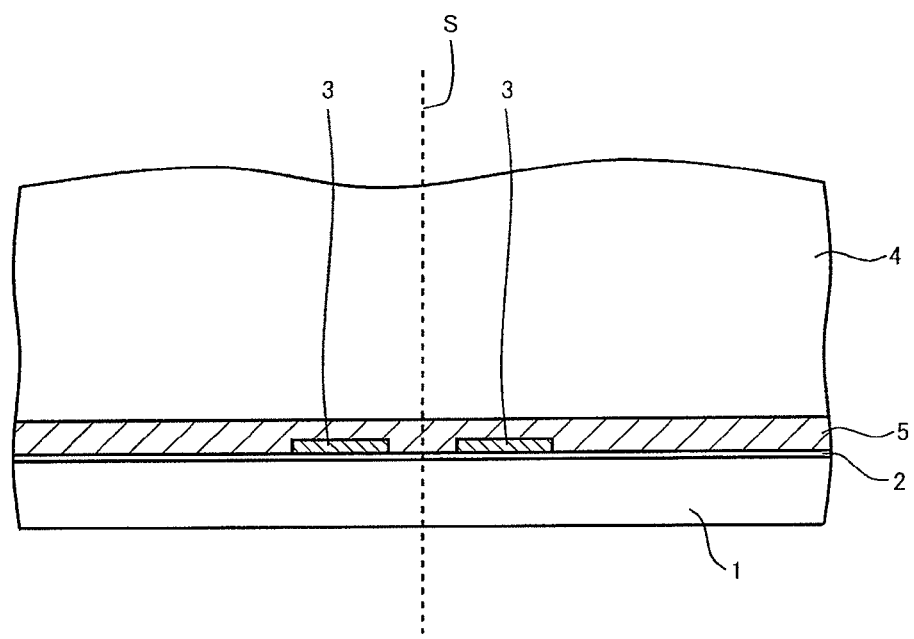
FIG. 4 is a cross-sectional view showing the method of manufacturing the semiconductor device of the first embodiment of the invention.

First, as shown in FIG. 4, a semiconductor substrate 1 is prepared. Semiconductor elements such as, for example, a CCD image sensor, a semiconductor memory or the like are formed on the semiconductor substrate 1 by a predetermined semiconductor manufacturing process. The first wirings 3 are formed on the front surface with a first insulation film 2 being interposed therebetween, being disposed at a predetermined interval near a dicing line S for dividing the semiconductor dies in a subsequent process. At this time, the first wiring 3 is a pad extended from a bonding pad of the semiconductor device 50 to near the dicing line S. In detail, the first wiring 3 is an external connection pad and electrically connected to a circuit (not shown) of the semiconductor device 50.

Then, the glass substrate 4 for use as a supporting substrate is bonded on the semiconductor substrate 1 on which the first wirings 3 are formed, using a resin 5 (e.g. epoxy resin) as a transparent adhesive. Although a glass substrate is used as the supporting substrate and an epoxy resin is used as the adhesive in the embodiment, a silicon substrate or a plastic substrate may be used as the supporting substrate and an adhesive suitable for this supporting substrate may be used as the adhesive.

Then, the surface of the semiconductor substrate 1 opposite to the surface on which the glass substrate 4 is bonded is back-ground to decrease the thickness of the substrate 1. Scratches occur on the back-ground surface of the semiconductor substrate 1, forming concaves and convexes with width and depth of about several μm. In order to minimize these concaves and convexes, the concaves and convexes of the semiconductor substrate 1 are wet-etched using an etchant of which the etching rate for the silicon substrate as the semiconductor substrate 1 is higher than that for the silicon oxide film 2 as the first insulation film 2.

Figure 5A:
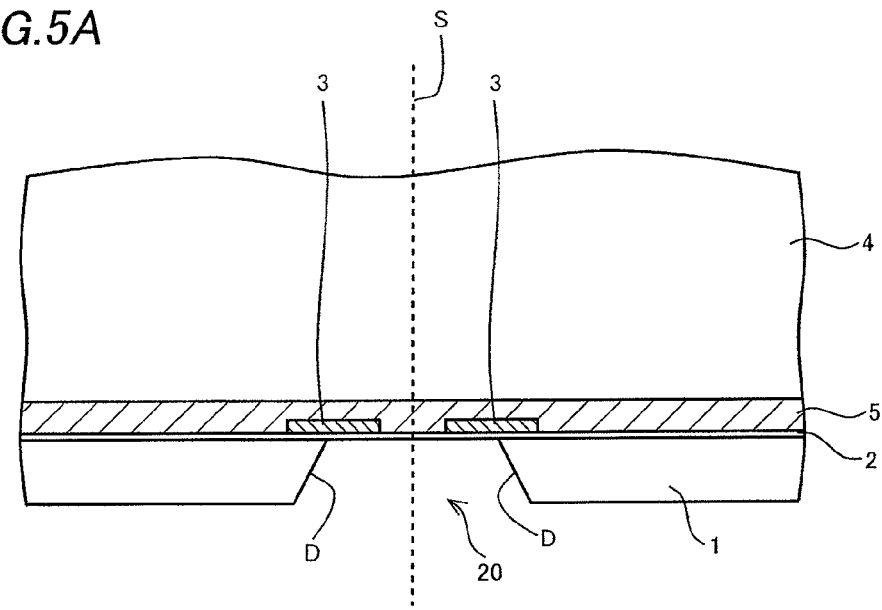
FIGS. 5A and 5B are cross-sectional views showing the method of manufacturing the semiconductor device of the first embodiment of the invention.
Figure 5B:
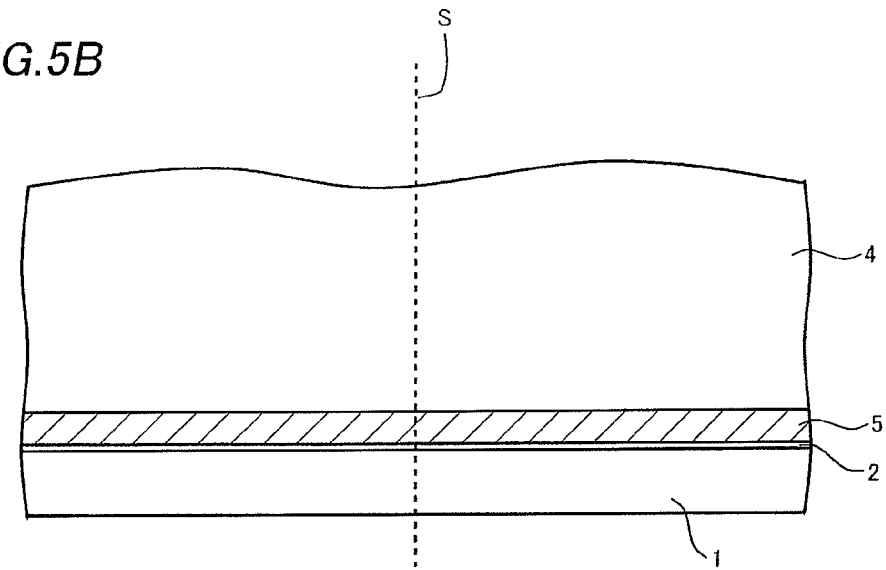

Then, as shown in FIGS. 5A and 5B, isotropic etching is performed to the semiconductor substrate 1 from the surface opposite to the surface on which the glass substrate 4 is bonded, using a resist pattern (not shown) as a mask provided with an opening so as to expose the first wirings 3 partially. As a result, as shown in FIG. 5A, a window 20 is formed around the dicing line S in a portion where the first wirings 3 exist, and the first insulation film 2 is exposed.

On the other hand, in a portion on the outside of the window 20 where the first wirings 3 do not exist, as shown in FIG. 5B, the semiconductor substrate 1 remains as it is. As a result, a plan view of the semiconductor device in FIGS. 5A and 5B on the semiconductor substrate 1 side is as shown in FIG. 13.

The window 20 has the step portion D with inclined sidewalls as shown in FIG. 5A. Furthermore, as shown in FIG. 13, the step portion D includes the step portions D1 extending perpendicular to the dicing line S and the step portions D2 extending parallel with the dicing line S. The directions of reflected light H1 and so on of exposure light H0 incident on the step portion in a photolithography process differ depending on the inclination angle of the step portion D. When the second wiring 8 is formed in a subsequent photolithography process, the abnormal narrowed portion 8a may be formed in the second wiring 8 on the lower surface of the step portion D, depending on the inclination angle of the step portion D.

Figure 14A:
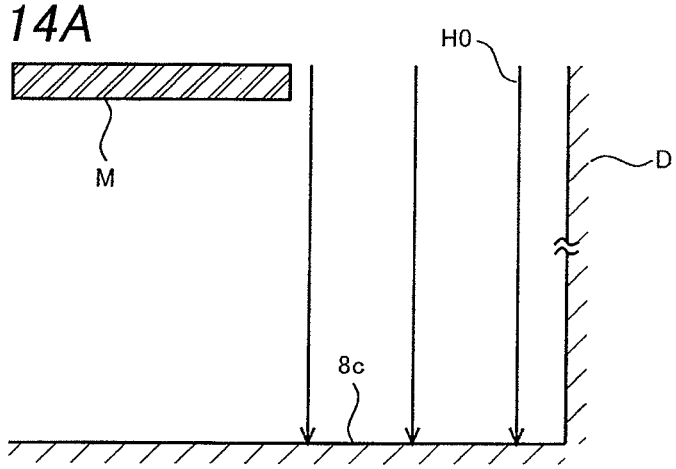
FIGS. 14A, 14B and 14C are views showing a state of reflection of incident exposure light at a step portion of a semiconductor substrate covered by a metal layer.
Figure 14B:
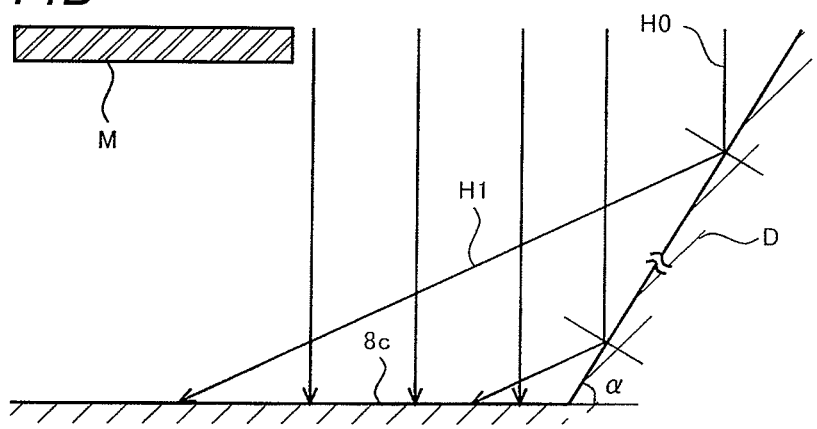
Figure 14C:
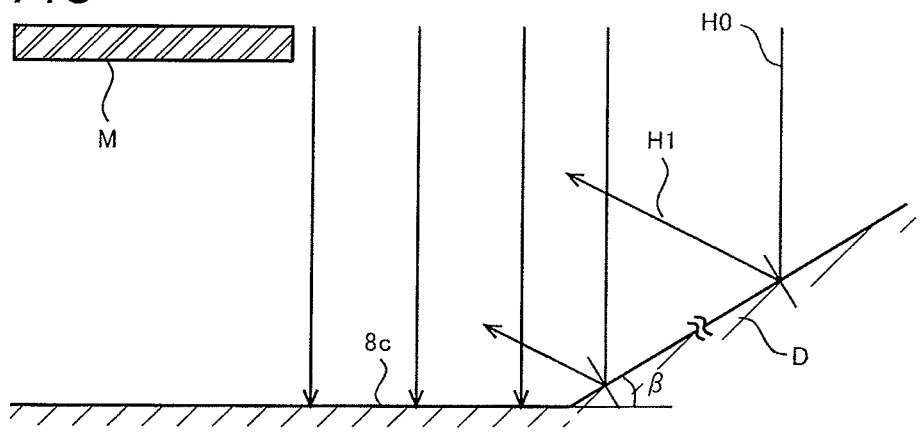

FIGS. 14A, 14B and 14C show the direction of reflected light H1 from the step portion D when exposed to light H0 in a photolithography process. FIG. 14A is in a case where the inclination angle of the step portion D is perpendicular to the bottom surface of the semiconductor substrate 1. In this case, the incident light H0 at the time of exposure in the photolithography process is parallel with the step portion D, and thus there does not exist reflected light H1 from the step portion D when exposed to the light H0. Therefore, the exposure light transfers a reticle pattern M as it is on a positive resist applied on a second wiring material 8c.

On the other hand, in a case where the inclination angle a of the step portion D is larger than 45° and smaller than 90° as shown in FIG. 14B, the reflected light H1 from the step portion D enters under the reticle pattern M. The reflected light H1 from a more upper level of the step portion D enters under the reticle pattern M more deeply. The positive resist even under the reticle pattern M is exposed to this reflected light H1, and a pattern narrower than the reticle pattern is transferred on the positive resist on the second wiring material 8c.

Furthermore, in a case where the inclination angle β of the step portion D is smaller than 45° as shown in FIG. 14C, the reflected light H1 reflected at the step portion D travels upward, and thus the positive resist under the reticle pattern M is not exposed to the light.

Therefore, when the second wiring 8 that will be described below is formed, in order to prevent the second wiring 8 from having the narrowed portion 8a by the reflected light H1 from the step portion D, the step portion D need have a vertical inclination angle or an inclination angle smaller than 45° so as to avoid the exposure of the positive resist under the reticle pattern M.

However, the vertical inclination angle of the step portion D degrades the step coverage of the second wiring 8 that is only several μm while the height of the step portion D is about 100 μm or more, and thus there occurs a problem such as the disconnection of the second wiring 8.

When the inclination angle of the step portion D is smaller than 45°, there occurs a problem that the occupation area of the step portion D is too large.

Therefore, the step portion D having the inclination angle a larger than 45° and smaller than 90° need be formed, and the black reticle pattern M having the same pattern as the second wiring 8 need be extended to over the back surface of the semiconductor substrate 1 on the outside of the topmost portion of the step portion D so as to prevent the reflected light H1 from occurring from the exposure light H0 incident on the step portion D and prevent the exposure light H0 from entering the step portion.

In the same manner as FIG. 5A and FIG. 5B, the following description about the subsequent processes uses A for a cross-sectional view of a portion where the window 20 is formed, and uses B for a cross-sectional view in a portion where the window 20 is not formed. However, for understanding the embodiment, the position of the cross-section in Fig. B is the back surface of the semiconductor substrate 1 near the step portion D1 on the outside of the window 20. In other words, Fig. A is a cross-sectional view along line B-B in FIG. 13, and Fig. B is a cross-sectional view along line C-C in FIG. 13.

Figure 6A:
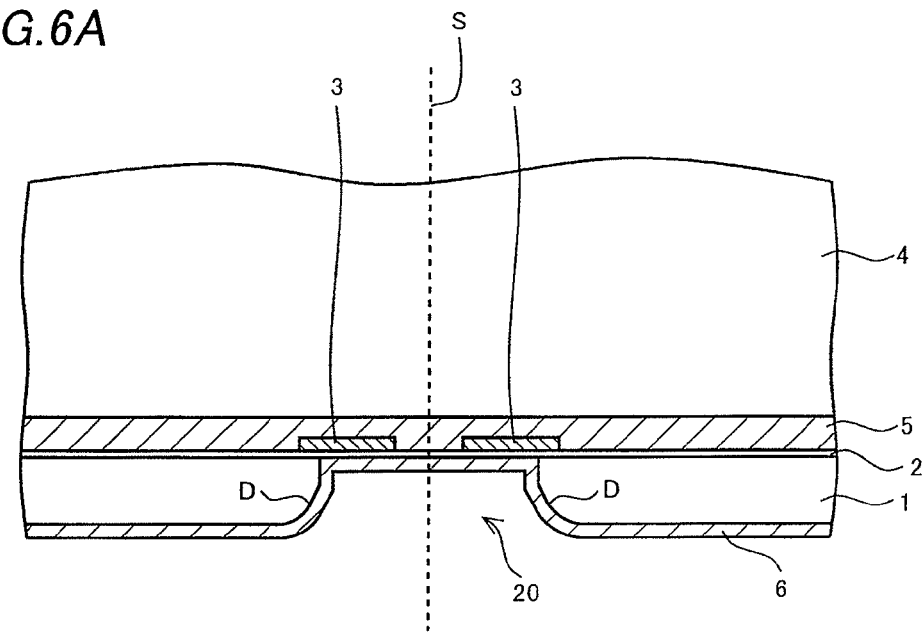
FIGS. 6A and 6B are cross-sectional views showing the method of manufacturing the semiconductor device of the first embodiment of the invention.
Figure 6B:
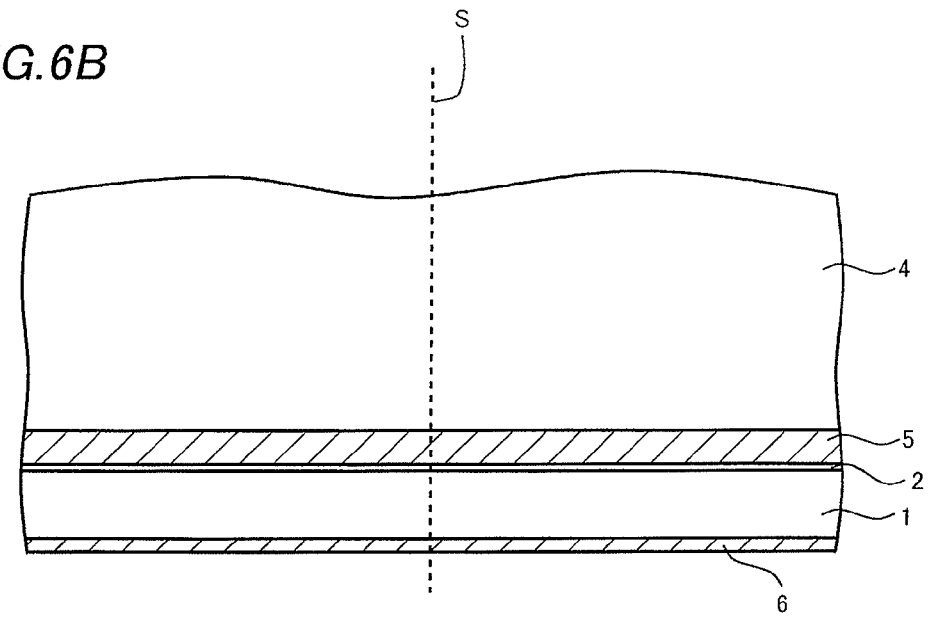

Then, as shown in FIGS. 6A and 6B, a second insulation film 6 is deposited on the surface of the semiconductor substrate 1 that is opposite to the surface where the substrate 4 is bonded. In the embodiment, a silane-based oxide film of about 3 μm is deposited.

Figure 7A:
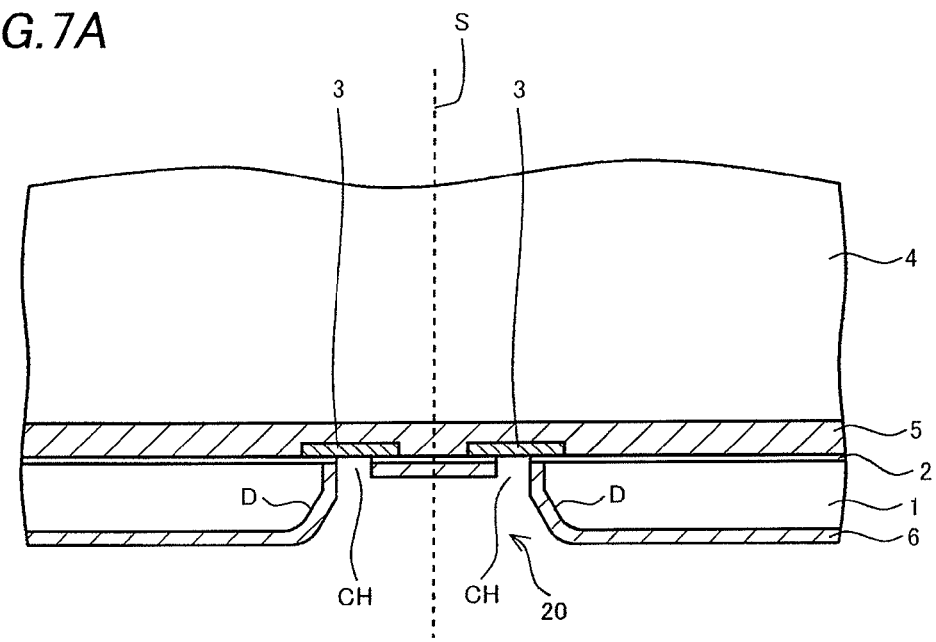
FIGS. 7A and 7B are cross-sectional views showing the method of manufacturing the semiconductor device of the first embodiment of the invention.
Figure 7B:
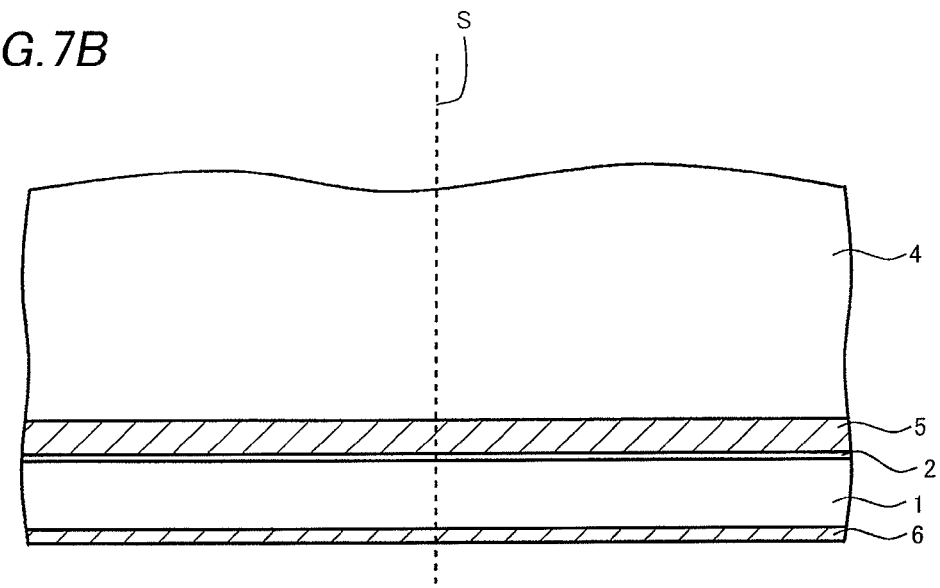

A resist (not shown) is then formed on the surface of the semiconductor substrate 1 that is opposite to the surface on which the glass substrate 4 is bonded and patterning is performed thereto so as to form contact holes CH for partially exposing the first wirings in the window 20, thereby forming a resist film. Then, as shown in FIGS. 7A and 7B, the second insulation film 6 and the first insulation film 2 are etched using the resist film (not shown) as a mask to form the contact holes CH and partially expose the first wirings 3.

Figure 8A:
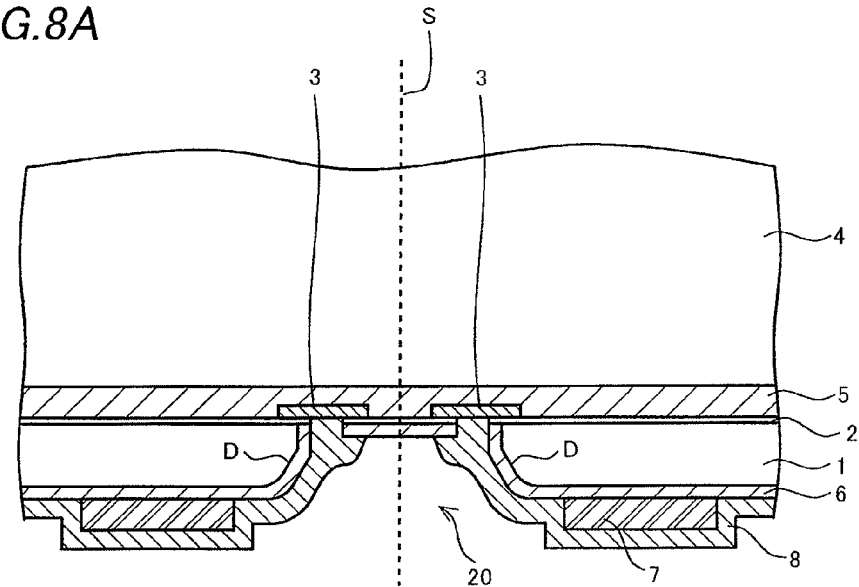
FIGS. 8A and 8B are cross-sectional views showing the method of manufacturing the semiconductor device of the first embodiment of the invention.
Figure 8B:
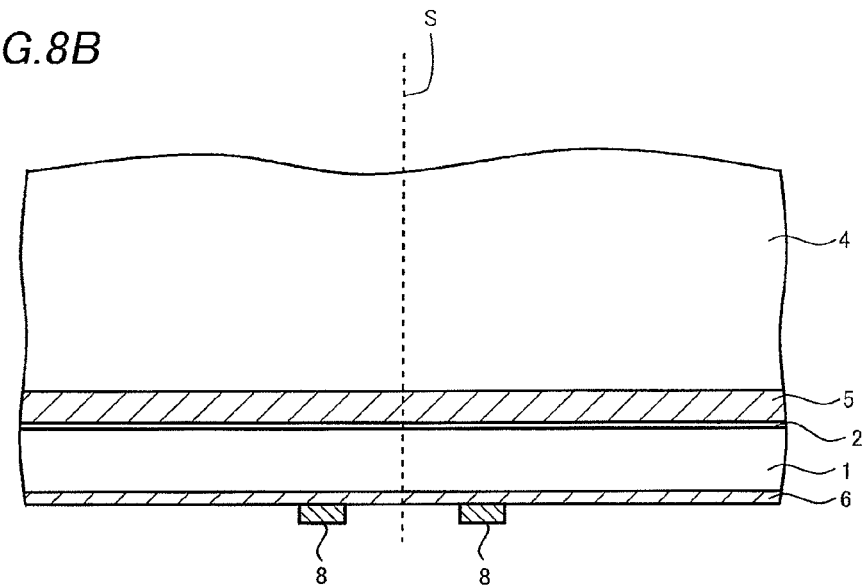

Then, as shown in FIGS. 8A and 8B, buffer members 7 having elasticity are formed in positions corresponding to conductive terminals 11 to be formed in a subsequent process. The buffer members 7 have a function of absorbing stress applied to the conductive terminals 11 and relieving stress applied when the conductive terminals 11 are bonded, although the buffer members 7 are not necessarily used in the invention.

The second wirings 8 are then formed on the surface opposite to the glass substrate 4. The structure of the second wiring is an important feature of the invention, and thus will be described in detail hereafter. First, the wiring material film such as aluminum is deposited on the back surface of the semiconductor substrate 1 including in the window 20 by a predetermined sputtering method or the like.

A positive resist is then applied on the wiring material film by a predetermined method. The positive resist applied on the wiring material film is then exposed to light through a reticle pattern that is black in a portion where the second wiring 8 is to be formed and transparent in the other portion. The exposed positive resist is dissolved and removed by a developer in the subsequent development process. The positive resist in the non-exposed portion remains on the wiring material film.

As a result, the pattern of the second wiring 8 by the positive resist is formed on the wiring material film. The wiring material film is then etched by predetermined wet-etching or dry-etching to form the second wiring 8. By this, the first wiring 3 and the second wiring 8 are electrically connected as shown in FIG. 8A.

The second wiring is connected to the first wiring 3 and extends over the step portion D onto the back surface of the semiconductor substrate 1 with the second insulation film 6 being interposed therebetween. The step portion D over which the second wiring 8 extends is the step portion D except in part of the step portions D1 near the dicing line S, which extend perpendicular to the dicing line S as shown in FIGS. 1 and 13. FIG. 8B shows the second wiring 8 in a portion on the back surface of the semiconductor substrate 1, extended from the step portions D1.

Furthermore, the region of the step portion D which the exposure light H0 enters is only the part of the step portions D1 near the dicing line S, which extend perpendicular to the dicing line S as shown in FIG. 1. The reflected light H1 from that portion does not enter under the reticle pattern M, and the abnormal narrowed portion 8a does not occur in the second wiring 8.

Figure 9A:
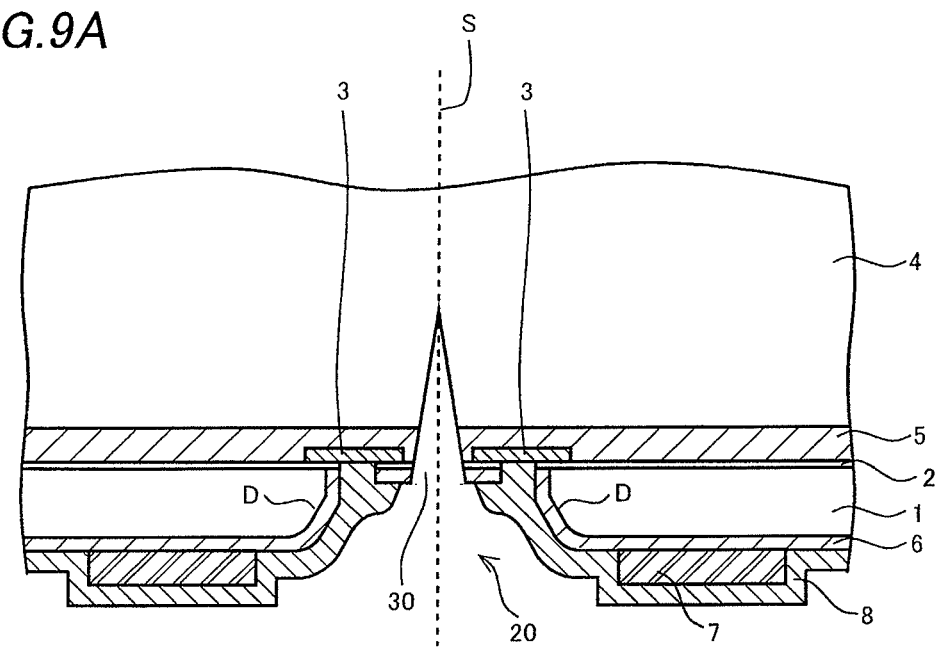
FIGS. 9A and 9B are cross-sectional views showing the method of manufacturing the semiconductor device of the first embodiment of the invention.
Figure 9B:
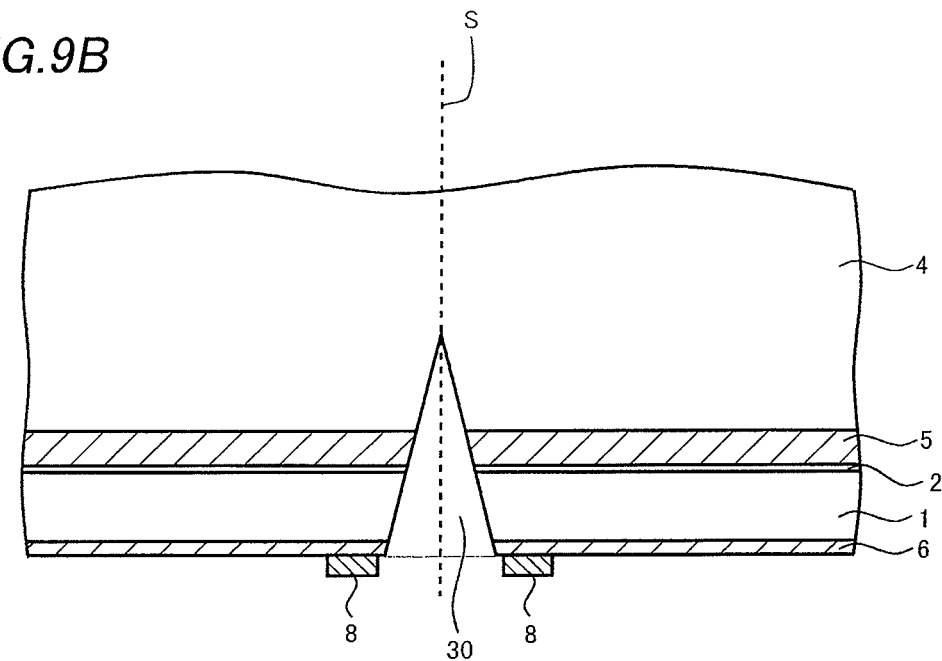

As shown in FIGS. 9A and 9B, the notch 30 (a reversed V shaped groove) is formed along the dicing line S by cutting the glass substrate 4 so as to have a depth of, for example, about 30 μm. FIG. 9B shows a region of a portion of the second wiring 8 extending over the step portions D1 onto the back surface of the semiconductor die 1a that is on the upper surface of the step portion D1 of the window 20. It is noted that the second wiring on the back surface is omitted in FIGS. 10B, 11B and 12B.

As shown in FIGS. 9A and 9B, the notch 30 is a reversed V shaped groove of which the start end portion of the notch 30 is wider than the end portion. Therefore, the notch 30 is formed closer to the end portion of the second wiring 8 on the step portion D1 and the end portion of the second wiring 8 on the back surface of the semiconductor substrate 1 that is on the upper surface of the step portion D1 than to the end portion of the second wiring 8 on the bottom surface of the window 20. Therefore, it is necessary to select a blade for forming the notch 30 that has a width such that the blade does not contact the end portion of the second wiring 8 formed on the back surface of the semiconductor die 1a that is on the upper surface of the step portion D1.

If the blade contacts the end portion of the second wiring 8 formed on the back surface of the semiconductor die 1a when the notch 30 is formed, the material of the second wiring is spread on the sidewall of the notch 30 by the blade. In this case, the second wiring and the semiconductor substrate 1 may be short-circuited through the material of the second wiring spread on the notch 30 by the blade.

Figure 10A:
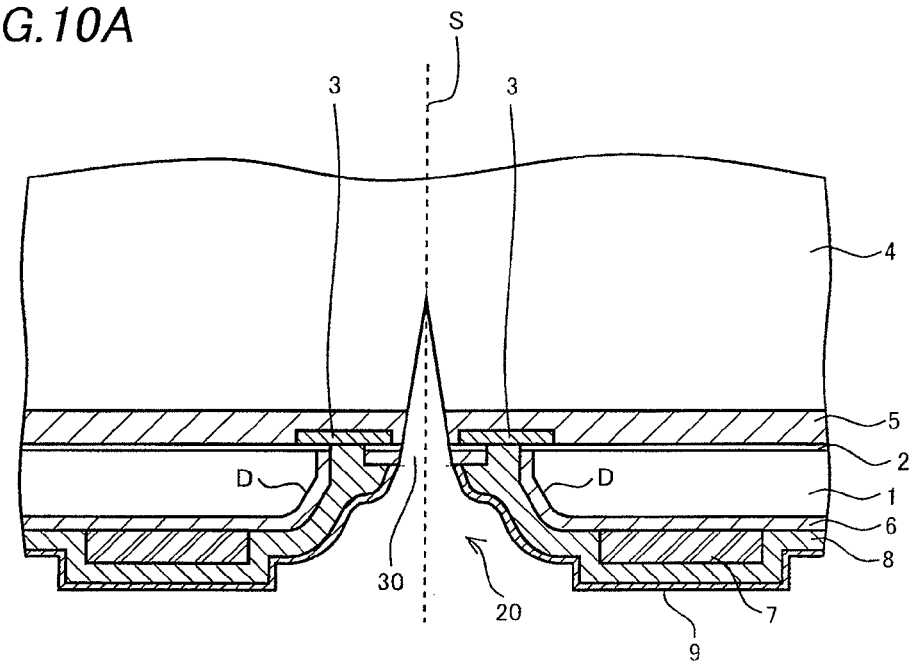
FIGS. 10A and 10B are cross-sectional views showing the method of manufacturing the semiconductor device of the first embodiment of the invention.
Figure 10B:
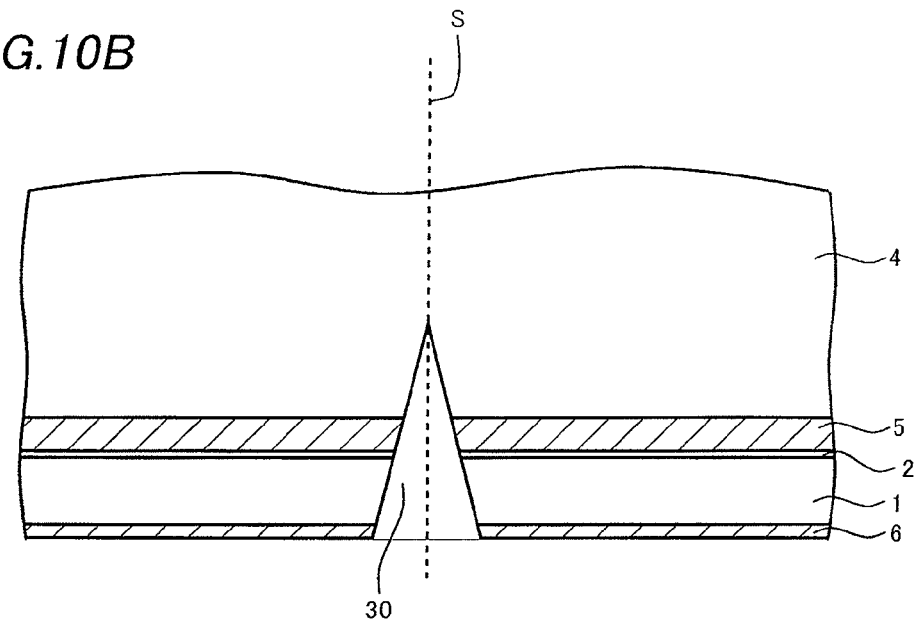

Then, as shown in FIGS. 10A and 10B, an electroless plating treatment is performed to the surface opposite to the glass substrate 4 to form the Ni—Au plating film 9 on the second wiring 8. This film is formed by plating, and thus formed only in the portion where the second wiring 8 exists.

Then, as shown in FIGS. 11A and 11B, the protection film 10 is formed on the surface opposite to the glass substrate 4. By this, the protection film 10 is formed on the back surface side of the semiconductor substrate 1 including on the inner sidewalls of the notch 30 formed along the dicing line S.

In detail, in the portion on the semiconductor substrate 1 where the first wirings 3 exist (i.e., in the portion along the dicing line S in the window 20), the protection film 10 is formed from the surface of the second insulation film 6 so as to cover the resin 5 and the glass substrate 4 exposed from the sidewalls of the notch 30.

On the other hand, on the other region on the semiconductor substrate 1 than the portion where the first wirings 3 exist (i.e., the region where the window 20 is not formed), the protection film 10 is formed from the surface of the second insulation film 6 so as to cover the exposed portions of the second insulation film 6, the semiconductor substrate 1, the first insulation film 2, the resin 5 and the glass substrate 4 that are exposed from the sidewalls of the notch 30.

Then, the protection film 10 in portions where the conductive terminals 11 are to be formed is removed by etching using a resist mask (not shown) (having openings in positions corresponding to the buffer members 7), and the conductive terminals 11 are formed on the Ni—Au plating film 9 in the positions corresponding to the buffer members 7. This conductive terminal 11 is electrically connected to the second wiring 8 through the Ni—Au plating film 9. The conductive terminal 11 is made of a solder bump or a gold bump.

Figure 12A:
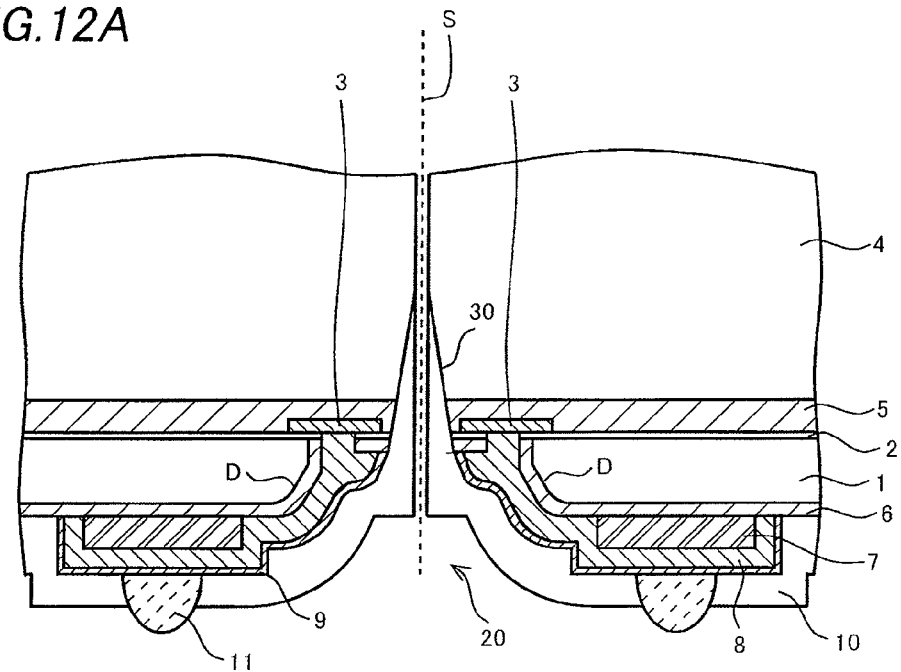
FIGS. 12A and 12B are cross-sectional views showing the method of manufacturing the semiconductor device of the first embodiment of the invention.
Figure 12B:
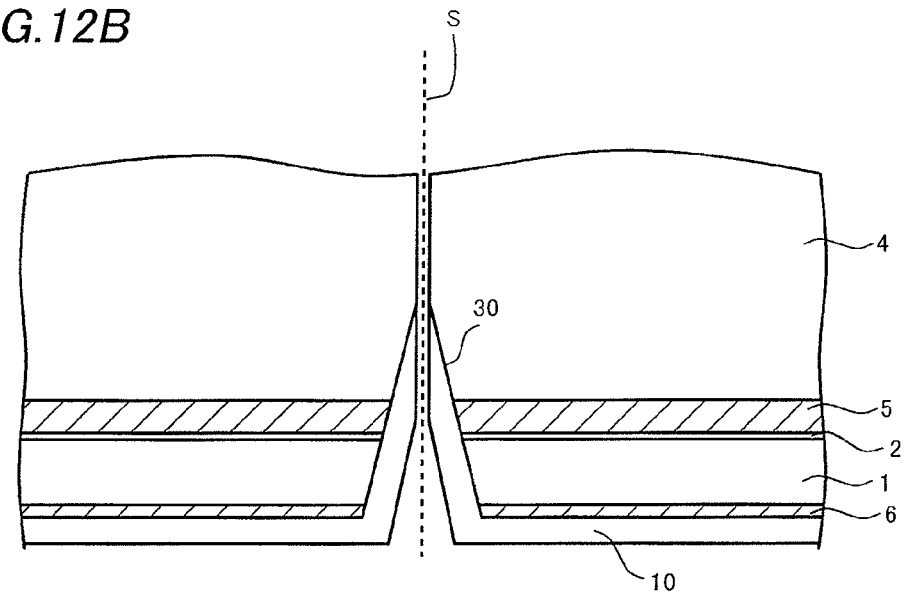
Figure 13:
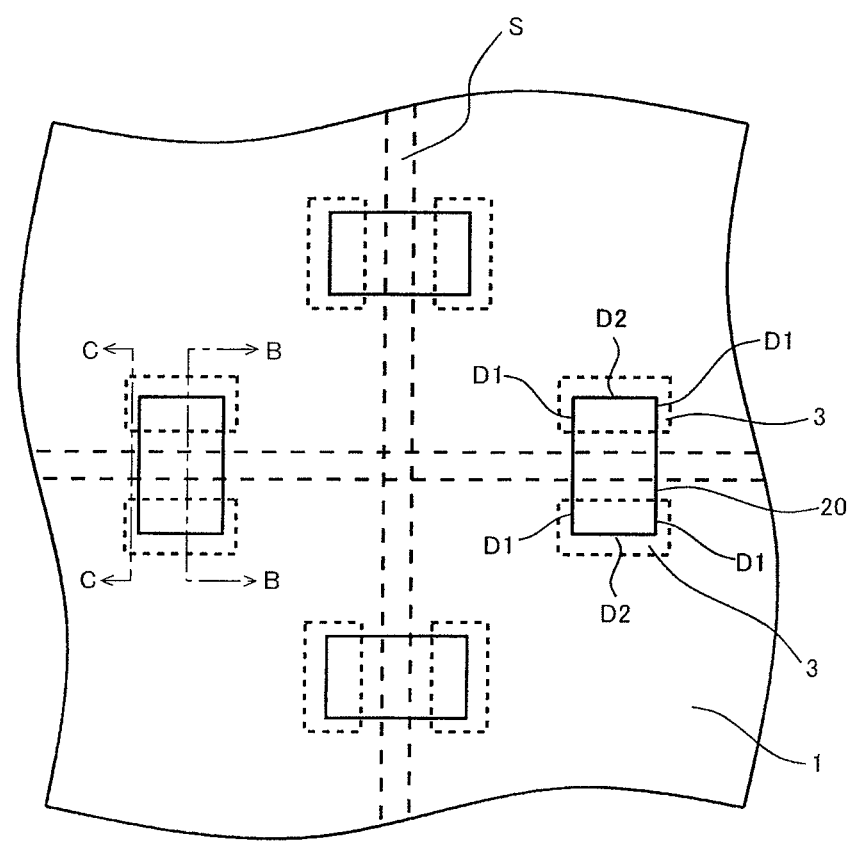
FIG. 13 is a plan view of a semiconductor device on the back surface, showing the semiconductor device and the method of manufacturing the same of the first embodiment of the invention.

Then, as shown in FIGS. 12A and 12B, dicing is performed along the dicing line S from the portion provided with the notch 30 to divide the semiconductor substrate 1 and so on into individual CSP type semiconductor devices 50 each having the semiconductor die 1*a* and so on. At this time, the blade used for the dicing need have a width such that the blade cuts the glass substrate 4 and the protection film in the notch 30 only.

As described above, in the method of manufacturing the semiconductor device of the embodiment, the second wiring 8 connected to the first wiring 3 and extending onto the back surface of the semiconductor substrate 1 with the second insulation film 6 being interposed therebetween extends over the step portion D except part of the step portions D1 near the dicing line S, which extend perpendicular to the dicing line S.

Therefore, since there does not exist reflected light H1 entering under the reticle pattern M from the step portion D, the second wiring 8 does not form the abnormal narrowed portion 8*a* on the lower surface of the step portion D, thereby enhancing the yield and reliability of the semiconductor device 50.

A second embodiment of the invention will be described referring to FIG. 15. FIG. 15 is an enlarged partial plan view of the semiconductor device 50 of the embodiment on the back surface side. In the case of the first embodiment, as described above, the width of the blade and so on need be determined strictly so as to prevent contact between the second wiring on the back surface of the semiconductor substrate 1 that is on the upper surface of the step portion D1 and the blade for forming the notch.

In ordinary arrangements of a blade and so on, in order to prevent contact between the second wiring 8 formed on the back surface of the semiconductor substrate 1 that is on the upper surface of the step portion D1 and the blade for forming the notch, it is effective that the second wiring 8 as shown in FIG. 1 has the same angle as the sidewalls of the notch 30 and is inclined in the opposite direction to the dicing line from the notch 30 instead of having a structure that the second wiring 8 extends over the step portion D except part of the step portions D1 near the dicing line S, which extend perpendicular to the dicing line S.

This structure prevents contact between the second wiring 8 formed obliquely on the step portion D1 and the sidewalls of the notch 30, and between the second wiring 8 formed on the back surface of the semiconductor substrate 1 that is on the upper surface of the step portion D1 and the sidewalls of the notch 30. However, since exposure light H0 enters part of the step portion D1, reflected light H1 thereof enters under the reticle pattern. It is necessary to determine a reticle pattern so as to prevent the second electrode 8 on the lower surface of the step portion from deforming by this reflected light beyond the tolerance.

On the other hand, this care is not necessary in the semiconductor device of the embodiment. As shown in FIG. 15, the second wiring 8 is extended over the step portion D2 onto the back surface of the semiconductor die 1*a*.

The whole inclined surfaces of the step portions D1 are covered by dummy wirings 8*b* separated from the second wiring 8. When the second wirings 8 are formed, a reticle pattern including black patterns of the second wiring 8 and the dummy wirings 8*b* is used. Therefore, exposure light H0 does not enter the step portions D1, and reflected light H1 does not enter under the reticle pattern of the second wiring 8. Therefore, the abnormal narrowed portion 8*a* is not formed in the second wiring on the bottom surface of the step portion D.

Furthermore, the second wiring 8 is not formed on the step portions D1 and on the back surface of the semiconductor substrate 1 that is on the upper surfaces of the step portions D1. Therefore, the blade for forming the notch 30 does not contact the second wiring 8. Although the blade for forming the notch 30 contacts the dummy wirings 8*b* formed on the step portions D1, the dummy wirings 8*b* are separated from the second wiring 8 and a problem does not occur.

The dummy wiring 8 is formed from a more inner position than the end surface E of the semiconductor device 50 in FIG. 15. Therefore, although part of the step portions D1 is exposed and reflected light H1 occurs from exposure light H0, the second wiring 8 is not formed in this portion and thus a problem does not occur. It is noted that the dummy wirings 8*b* may be formed further closer to the end surface E.

The method of manufacturing the semiconductor device of the embodiment differs from the first embodiment only in the reticle pattern for forming the second wiring 8 and so on, and is the same as the first embodiment except this.

In the semiconductor device and the method of manufacturing the same of the invention, the second wiring does not form an abnormal narrowed portion on the lower surface of the step portion. Therefore, a semiconductor device having high yield and reliability is realized.

What is claimed is:
1. A semiconductor device comprising:
a support substrate having a dicing line;
a semiconductor die attached to the support substrate and having a first inclined surface, a second inclined surface and a third inclined surface, wherein;
  each of the first, the second and the third inclined surfaces is disposed between a back surface and an end surface of the semiconductor die;
  from a plan view, each of the first, the second and the third inclined surfaces has a length and a width;

from a plan view, each of the first and the second surfaces lies along a line that intersects the dicing line;

from a plan view, the third inclined surface is disposed between the first and the second inclined surfaces; and wherein the third inclined surface is perpendicular to at least one of the first and the second inclined surfaces;

a first wiring disposed at an elevation between the support substrate and the semiconductor die, wherein the first wiring is adjacent to the dicing line of the support substrate and the end surface of the semiconductor die; and a second wiring electrically connected to the first wiring, wherein the second wiring, from a plan view:

the second wiring is fully disposed over the third inclined surface; and wherein the second wiring is disposed over entire width of the first inclined surface along a first distance, as measured from the third inclined surface towards the dicing line, the first distance being less than the length of the first inclined surface; and the second wiring is disposed over the entire width of the second inclined surface along a second distance, as measured from the third inclined surface towards the dicing line, the second distance being less than the length of the second inclined surface.

2. The semiconductor device of claim 1, wherein the first inclined surface is parallel with the second inclined surface.

3. The semiconductor device of claim 1, wherein the third inclined surface is perpendicular to the first inclined surface.

4. The semiconductor device of claim 1, wherein the third inclined surface is perpendicular to the second inclined surface.

5. The semiconductor device of claim 1, wherein the first, the second, and the third inclined surfaces each have a length, L, and a width, W, and wherein L>W.

6. The semiconductor device of claim 1, wherein a recess is disposed between the first and the second inclined surfaces.

7. The semiconductor device of claim 6, wherein the recess is wider at the back surface of the semiconductor die than at a front surface of the semiconductor die.

8. The semiconductor device of claim 1, wherein, from a cross-sectional view, the second wiring extends continuously from the back surface of the semiconductor die adjacent to the first inclined surface to the back surface of the semiconductor die adjacent to the second inclined surface.

9. The semiconductor device of claim 8, wherein, from a plan view, the second wiring extends beyond the widths of each of the first and second inclined surfaces.

10. The semiconductor device of claim 1, further comprising an adhesive layer disposed between the semiconductor die and the support substrate.

11. A semiconductor device comprising: a support substrate having a dicing line; a semiconductor die attached to the support substrate, wherein the semiconductor die has:

a first inclined surface and a second inclined surface each disposed between a back surface and an end surface of the semiconductor die, each of the first and second inclined surfaces having a length and a width;

a third inclined surface disposed between the back surface and the end surface of the semiconductor die, wherein, in plan view, the third inclined surface is disposed between the first and the second inclined surfaces, and wherein the third inclined surface has a length and a width, and wherein the third inclined surface is perpendicular to at least one of the first and the second inclined surfaces;

a first wiring disposed at an elevation between the support substrate and the semiconductor die, wherein the first wiring is adjacent to the dicing line of the support substrate and the end surface of the semiconductor die; and a second wiring electrically connected to the first wiring, wherein the second wiring, in plan view, is: disposed over the third inclined surface, disposed over the width of the first inclined surface along a first distance, as measured from the third inclined surface towards the dicing line, the first distance being less than the length of the first inclined surface, and disposed over the width of the second inclined surface along a second distance, as measured from the third inclined surface towards the dicing line, the second distance being less than the length of the second inclined surface.

12. The semiconductor device of claim 11, wherein, from a plan view, the lengths of each of the first, the second, and the third inclined surfaces is greater than the width thereof.

13. The semiconductor device of claim 11, wherein, from a plan view, the second wiring extends beyond the widths of each of the first and second inclined surfaces.

14. The semiconductor device of claim 11, wherein, from a plan view, the second wiring extends beyond the width of the third inclined surface.

15. The semiconductor device of claim 11, wherein the first and second inclined surfaces extend along the semiconductor die in parallel orientation.

* * * * *